United States Patent [19]

Engelman et al.

[11] 4,423,357

[45] Dec. 27, 1983

[54] SWITCHABLE PRECISION CURRENT SOURCE

[75] Inventors: Jeffery A. Engelman, Longmont; James L. Sanford, Boulder, both of Colo.

[73] Assignee: International Business Machines Corporation, Armonk, N.Y.

[21] Appl. No.: 390,590

[22] Filed: Jun. 21, 1982

[51] Int. Cl.³ .............................................. H03K 17/60

[52] U.S. Cl. .................................... 315/307; 307/255; 307/297; 315/208

[58] Field of Search ........................ 315/291, 307, 208; 307/242, 254, 255, 297, 311, 313, 315

[56] References Cited

U.S. PATENT DOCUMENTS

| | | | |
|---|---|---|---|
| Re. 29,619 | 4/1978 | Pastoriza | 340/347 |
| 3,562,557 | 2/1971 | Gates | 307/255 |
| 3,626,211 | 12/1971 | Formeister | 307/313 |
| 3,787,734 | 1/1974 | Dorler et al. | 307/254 X |
| 4,118,712 | 10/1978 | Kawasaki | 354/23 D |
| 4,277,696 | 7/1981 | Tokunaga et al. | 307/255 |
| 4,282,478 | 8/1981 | Leidich | 323/316 |

*Primary Examiner*—Eugene R. Laroche
*Attorney, Agent, or Firm*—Carl M. Wright

[57] ABSTRACT

Three-transistor, four-terminal precision current source is switchable. Current is passed between two of the terminals in the presence of a switching signal on another terminal. While switched on, the current is regulated according to a reference voltage supplied to the remaining terminal.

7 Claims, 1 Drawing Figure

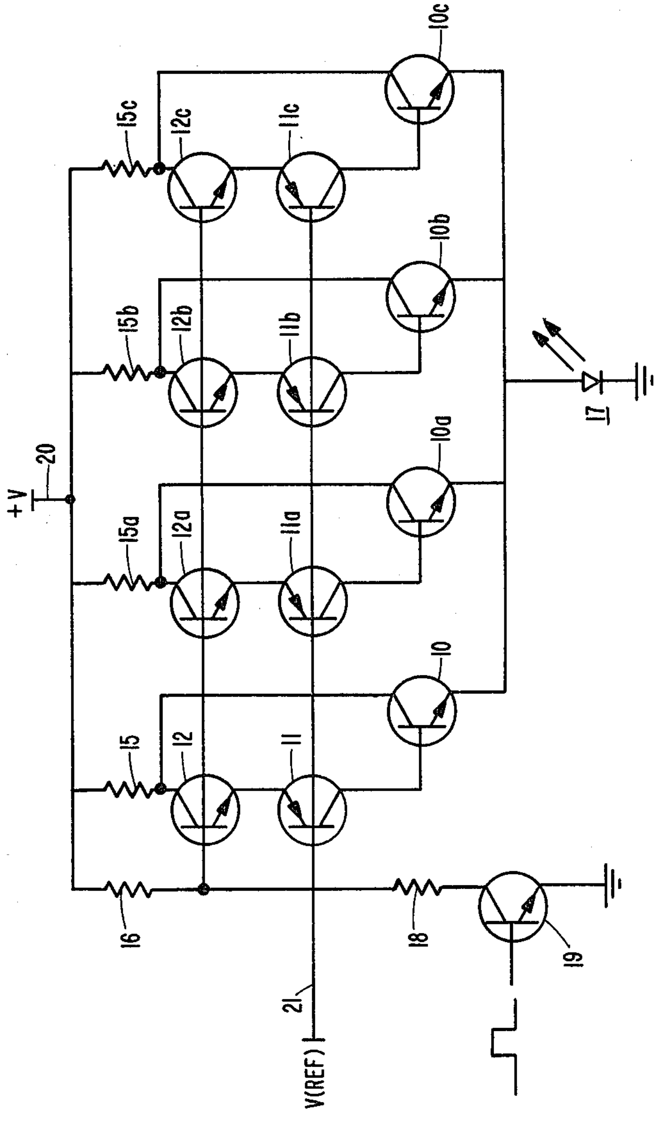
+V
20
15
15a
15b
15c
12
12a
12b
12c
11
11a
11b
11c
10
10a
10b
10c
16
18
19
17
21
V(REF)

SWITCHABLE PRECISION CURRENT SOURCE

TECHNICAL FIELD

This invention relates to constant current supplies, and particulary to switchable precision current supply circuits that can be easily integrated in parallel.

Although constant current supply sources are well known, switchable current sources present difficult problems, especially when it is desired to be able to integrate the circuits on a substrate. Usually, precision current sources that are switchable require a large number of stages or active elements, such as transistors. The size and complexity of the circuits also increase as the required current increases.

The circuits become more complicated when there are additional constraints. The latter may include special load requirements such as common-cathode light-emitting diodes (LED's). It may be desirable to drive up to 3000 such LED's each requiring 10 to 40 milliamperes current which must be essentially equal.

BACKGROUND ART

U.S. Pat. No. 4,118,712 discloses the use of switchable current sources for digital-to-analog conversion of a counter value. The switched currents are proportional to the binary values of the signals used for switching. The switched currents are summed to produce a voltage that is proportional to the logarithm of the binary value being converted.

U.S. Pat. No. Re. 29,619 also shows digital-to-analog conversion using switchable current sources and current summing. Another constant current switching circuit is shown in U.S. Pat. No. 3,787,734 which also uses a constant voltage reference source.

U.S. Pat. No. 4,282,478 shows the sensing of a current through the load using a voltage drop resistor in conjunction with a threshold detector for controlling the current.

U.S. Pat. No. 4,277,696 shows a three-transistor, three-terminal switching circuit using an inverted Darlington pair to provide thyristor switching action.

These references are typical of the current sources and switching circuits that are found in the prior art, but none of the references found in the prior art show or suggest the invention as claimed herein.

DISCLOSURE OF THE INVENTION

In accordance with the present invention, a switchable current source is coupled between a power supply and a load and utilizes three transistors. A first transistor is coupled from the power supply to the load. Two other complementary transistors have their emitters coupled together and their collectors coupled between the base and collector of the first transistor. One of the two complementary transistors has its base coupled to a switching signal source and the other has its base coupled to a reference level voltage. The latter regulates the current through the first transistor and the other switches the current on or off.

This circuit arrangement allows several stages to be coupled in parallel to provide more current switching capacity. It can be easily integrated on a substrate because it contains few components.

BRIEF DESCRIPTION OF THE DRAWING

The drawing FIGURE is a schematic showing the use of the invention to provide current to a light-emitting diode using four circuits of the invention in parallel to increase the current supplied to the load.

DETAILED DESCRIPTION

As shown in the FIGURE, four parallel circuits are coupled between a power source 20 and a load 17. The operation of each of the circuits is the same and therefore, only the first one need be explained in detail.

The current to the load is carried by a transistor 10 which is connected at its collector end to the power source 20 by a resistor 15 which acts to limit the maximum current through the transistor 10 and to insure that all parallel branches carry an equal amount of the load current.

The main drive transistor 10 has its base coupled to its collector through two complementary transistors 11 and 12. The base of the transistor 11 is coupled to a reference voltage source 21. The action of the transistor 11 is to regulate the current through the driver transistor 10. To regulate is herein used to mean to determine the amount of current, i.e., to provide a constant current through the driver transistor 10.

The base of the other complementary transistor is coupled to a switching signal source which may include, as shown in the FIGURE, a level shifting circuit comprising a transistor 19 and a voltage divider comprising the resistors 16 and 18. The action of the transistor 12 is to control the current through the driver transistor 10. To control is herein used to mean to turn off or to turn on the current flow through the transistor 10.

When the transistor 12 is turned on by a suitable switching signal, it is driven into the saturation region so that the voltage drop from its collector to its emitter is a small and constant value. Since the resistance 15 is assumed to be very small compared to the emitter resistance and the base spreading resistance of the transistor 11, the base-to-emitter voltage drop of the latter is maintained substantially constant and consequently, the current through the transistor 11 is constant. Since the current passed by the driver transistor 10 is proportional to its base current, which is the current through the transistor 11, the current supplied to the load through the driver transistor 10 remains constant while the transistor 12 is turned on.

Turning off the transistor 12 by a suitable change in the switching signal cuts off the current through the transistor 11 which, in turn, cuts off the current through the driver transistor 10.

Therefore, due to the action described above, the current through the drive transistor 10 is turned on and off via the action of the applied switching signal. While turned on, the current is regulated to a precise value.

Although the transistors 11 and 12 are shown and described as complementary transistors, they can also be of the same type as long as they are coupled in series so as to conduct in the same direction. That is, if they are transistors of the same polarity, preferably PNP types, the collector and emitter of the transistor 12 would be reversed from the orientation shown in the FIGURE.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A switchable current source comprising:

a load;

power source means for supplying current;

a reference voltage source means;

a switching signal source means;

first transistor means coupled between said power source means and said load, having a collector means and an emitter means coupled thereto, respectively;

second and third transistor means coupled together in series to conduct in the same direction between said power source means to a base means of said first transistor;

means for coupling said reference voltage source means to a base means of said third transistor for regulating the current therethrough; and means for coupling said switching signal source means to a base means of said second transistor means for controlling the current therethrough.

2. The invention as claimed in claim 1 wherein said switching signal source means includes fourth transistor means for translating a switching signal at one level of a switching signal at another level.

3. The invention as claimed in claim 1 wherein said load includes a light-emitting diode means.

4. The invention as claimed in claim 1 including additional circuits of the same type coupled in parallel between said load and said power source means.

5. A semiconductor current drive circuit for supplying a switchable controlled current to a load comprising, in combination:

load means;

power supply means for supplying current to the circuit;

means for supplying a reference voltage;

means for supplying a switching signal;

output transistor means for supplying current to said load, said output transistor having a base means, a collector means coupled to said power supply means, and an emitter means coupled to said load means;

a pair of complementary transistor means for controlling the current through said output transistor means, each of said pair of complementary transistor means having emitter means, base means, and collector means;

means for coupling together the emitter means of said pair of complementary transistor means;

means for coupling the collector of one of said pair of complementary transistor means to the base of said output transistor means;

means for coupling the base of said one of said pair of complementary transistor means to said reference voltage supplying means;

means for coupling the collector of the other one of said pair of complementary transistor means to the power supply means; and means for coupling the base of the other one of said pair of complementary transistor means to switching signal supplying means.

6. The invention as claimed in claim 5 wherein said means for supplying a switching signal comprises switching transistor means having a base means for receiving a signal referenced to a common return potential of said power supply means, an emitter means coupled to said common return potential, and a collector means coupled to supply a switching signal referenced to the base of said other one of said pair of complementary transistor means.

7. The invention as claimed in claim 6 including voltage divider means coupled between said power supply means and said collector means of said switching transistor.

* * * * *